United States Patent [19]

Konishi et al.

[11] Patent Number: 4,757,367
[45] Date of Patent: Jul. 12, 1988

[54] LIGHT TRIGGERED SEMICONDUCTOR DEVICE WITH DETACHABLE AUXILIARY THYRISTER

[75] Inventors: Nobutake Konishi, Hitachiota; Yoshiteru Shimizu, Katsuta; Takeshi Yokota, Hitachi, all of Japan

[73] Assignee: Hitachi, Ltd., Tokyo, Japan

[21] Appl. No.: 797,965

[22] Filed: Nov. 14, 1985

[30] Foreign Application Priority Data

Nov. 16, 1984 [JP] Japan .................. 59-240478

[51] Int. Cl.⁴ .......................................... H01L 29/74
[52] U.S. Cl. ............................... 357/38; 357/75; 357/74; 357/51; 357/81; 357/80
[58] Field of Search .................. 357/38, 80, 74, 75, 357/81, 51

[56] References Cited

U.S. PATENT DOCUMENTS

| | | | |
|---|---|---|---|
| 4,143,395 | 3/1979 | Jekiba | 357/81 X |
| 4,374,393 | 2/1983 | Kamahara | 357/75 X |
| 4,386,362 | 5/1983 | Kessler, Jr. et al. | 357/74 X |
| 4,479,696 | 10/1984 | Lubin et al. | 357/74 X |
| 4,521,170 | 6/1985 | Klein | 357/81 D |
| 4,553,813 | 11/1985 | McNaughton et al. | 357/75 X |
| 4,677,454 | 6/1987 | Kiyohara | 357/74 X |

FOREIGN PATENT DOCUMENTS

| | | | |
|---|---|---|---|
| 55-52261 | 10/1979 | Japan | 357/74 X |
| 55-52259 | 4/1980 | Japan | 357/38 LA |
| 56-56683 | 5/1981 | Japan | 357/38 LA |

OTHER PUBLICATIONS

Silber et al, "Light Activated Auxiliary Thyristors," *IEEE Conference: 1978 International Electron Devices Meeting,* Washington, D.C., U.S.A. (Dec. 4-6, 1978), pp. 575-578.

Primary Examiner—Andrew J. James
Assistant Examiner—William A. Mintel
Attorney, Agent, or Firm—Antonelli, Terry & Wands

[57] ABSTRACT

There is provided a light triggered thyristor device comprising a main thyristor triggered by an electric triggering signal, an auxiliary thyristor triggered by a light signal applied to a light receiving portion, the auxiliary thyristor then supplying the electric triggering signal from a cathode thereof to a gate of the main thyristor, a cylindrical insulator for containing the main thyristor, a connector mechanism disposed near an end of an anode on a side face of the main thyristor and electrically connected to the anode of the main thyristor, the connector mechanism having one end side exposed to outside of the cylindrical insulator, the auxiliary thyristor being so attached to one end side of the connector mechanism as to enable their free connection and disconnection, the anode of the main thyristor being electrically connected to the anode of the auxiliary thyristor via the connector mechanism.

9 Claims, 4 Drawing Sheets

LIGHT TRIGGERED SEMICONDUCTOR DEVICE WITH DETACHABLE AUXILIARY THYRISTER

BACKGROUND OF THE INVENTION

The present invention relates to a light triggered semiconductor device having a light triggered auxiliary thyristor for triggering a main thyristor, and in particular to a light triggered semiconductor device having an auxiliary thyristor disposed outside the package of the main thyristor.

In recent years, light triggered thyristors which can be controlled to be triggered by light signals came into use as thyristors having high blocking voltage and large current capacity applied to high-voltage conversion devices such as high-voltage DC transmission devices.

As such a light triggered thyristor having high blocking voltage and large current capacity, a light triggered thyristor device of the so-called light triggered auxiliary thyristor system is known. In this system, a small capacity light triggered thyristor is used as the auxiliary thyristor and the main thyristor is triggered by the output of the auxiliary thyristor as disclosed in Japanese Patent Unexamined Publication Nos. 55-52261 and 56-56683, for example. Since the light triggered auxiliary thyristor itself may have a small current capacity in this system, the temperature rise at the semiconductor junction of the auxiliary thyristor can be limited to a value lower than that of the main thyristor. Accordingly, the most important development problem relating to the characteristics of the light triggered thyristor, namely the trade-off relationship between light sensitivity and dv/dt capability is easily improved. On the other hand, a new problem is incurred. That is to say, special consideration must be paid to a coupling structure between the light triggered auxiliary thyristor and the electrical triggered thyristor for the main circuit.

That is to say, the light triggered thyristor device disclosed in the above described Japanese Patent Unexamined Publication No. 55-52261 has a light triggered auxiliary thyristor disposed outside the package of the main thyristor and attached to a radiator. In this case, it is difficult to replace the auxiliary thyristor alone. In addition, the above described radiator must have a special structure for fixing the auxiliary thyristor.

On the other hand, the light triggered thyristor disclosed in the above described Japanese Patent Unexamined Publication No. 56-56683 has an auxiliary thyristor contained in the package of the main thyristor. In this case, the above described package must have a portion for fixing the auxiliary thyristor, resulting in the complicated package structure. Further, the auxiliary thyristor might be affected by the heat confined inside of the package.

In the light triggered thyristor device of this light triggered auxiliary thyristor system, it is desired that the combination of blocking voltage, current capacity and turn-on time between the auxiliary thyristor and the main thyristor is provided with sufficient freedom. This problem of freedom is not recognized in the above described prior art.

SUMMARY OF THE INVENTION

An object of the present invention is to provide a light triggered semiconductor device of a light triggered auxiliary thyristor system which is free from the above described drawbacks of the light triggered thyristor device of the prior art, which can be easily handled as a single thyristor, which does not need any special consideration for the radiator, which gives sufficient freedom to the combination between the light triggered auxiliary thyristor and the main thyristor, and which has a simple structure.

In accordance with the present invention, therefore, a connector mechanism electrically connected to the anode of the main thyristor is disposed on the side face of the main thyristor near the end of the anode of the main thyristor so that the light triggered auxiliary thyristor may be removably attached to the side face of the main thyristor.

DESCRIPTION OF THE PREFERRED EMBODIMENT

The light triggered semiconductor device according to the present invention will now be described in detail by referring to drawings.

Figure 1:
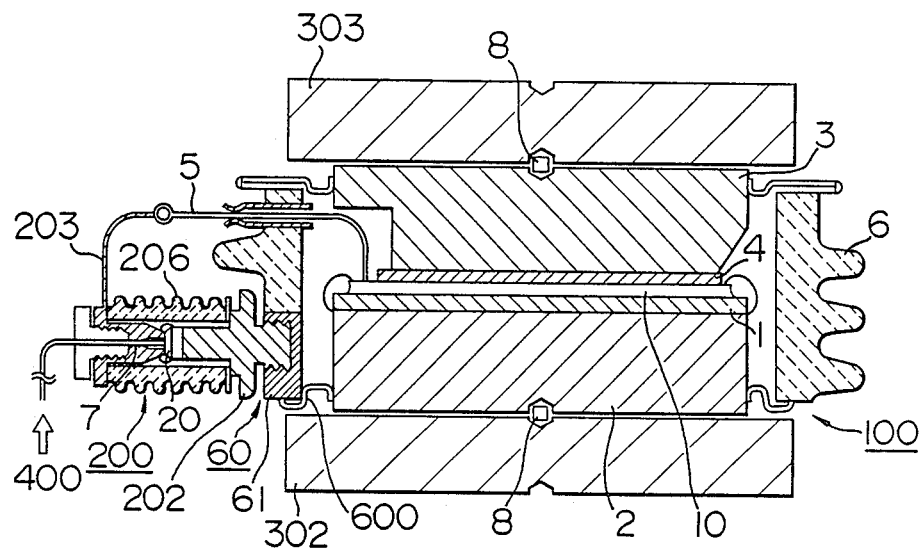
FIG. 1 is a sectional view of a first embodiment of a light triggered semiconductor device according to the present invention.

FIG. 1 is a sectional view of a first embodiment of a light triggered semiconductor device according to the present invention.

In FIG. 100, reference numeral 1 denotes a main thyristor of flat type (also referred to as disk type) which is turned on by an electric gate signal. The main thyristor comprises a thyristor pellet 10 backed with a tungsten disk 1, an anode conductive member 2 which is in contact with the pellet 10 with low resistivity, a cathode conductive member 3, an electrode plate 4 for bringing the cathode conductive member 3 into contact with the cathode electrode of the pellet 10 with low resistivity, a gate lead wire 5 which is in contact with the gate portion, a hollow cylindrical insulator 6 for containing the pellet, and a connector portion 60 for fixing the light triggered auxiliary thyristor. The connector portion 60 includes a screwed (female screwed, for example) metal member 61 which mates with the screwed (male screwed, for example) anode end of the auxiliary thyristor.

On the other hand, a light triggered auxiliary thyristor 200 of stud type includes an auxiliary thyristor pellet 20, a cathode electrode 203 connected to the gate lead wire 5 of the main thyristor pellet 10, an anode electrode connected via low resistance to the metal member 61 which is connected to the anode conductive member 2 and which is attached to a part of the hollow cylindrical insulator 6, an optical fiber 7 for conveying an external light signal 400 to the auxiliary thyristor pellet 20 to turn it on, and a hollow cylindrical insulator 206. Reference numerals 302 and 303 denote cooling pieces (radiator pieces) for cooling the main thyristor 100.

Since the electric gate main thyristor 100 and the auxiliary thyristor 200 which are principal constituents of this embodiment can be respectively produced by using well-known conventional methods, their production methods will not be described. Their construction methods will now be described briefly.

Figure 2:
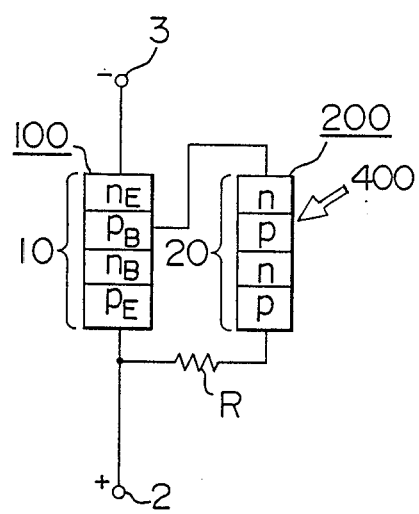
FIG. 2 is an equivalent circuit diagram of a light triggered semiconductor device according to the present invention.

At first, the main thyristor 100 and cooling pieces 302 and 303 are located by using alignment pins 8 as reference and are pressed and fixed by suitable means. Subsequently, the anode electrode 202 of the auxiliary thyristor 200 is screwed to the connector portion 60 having a screwed metal portion 61 for fixing the auxiliary thyristor. The connector portion is fixed to the hollow cylindrical insulator 6 of the main thyristor 100. The screwed metal portion 61 is connected to the anode electrode 2 of the main thyristor 100 via a spring-like metal member 600 having low resistivity and they are bound by silver solder or the like. In addition, the cathode electrode 203 of the auxiliary thyristor 200 is coupled to the gate lead wire 5 of the main thyristor 100. For this coupling, an arbitrary method such as screw clamp or soldering may be employed. From a viewpoint of construction work, it is desirable to employ a mechanism facilitating connection and disconnection when the auxiliary thyristor 200 is to be attached and removed. FIG. 2 shows an equivalent circuit of a light triggered semiconductor device according to the present invention. In FIG. 2, R represents a resistor for limiting a current capability and corresponds to the screwed metal portion 61 in the embodiment of FIG. 1.

Operation of the embodiment will now be described.

It is now assumed that a light signal 400 is applied to the auxiliary thyristor when the anode conductive member 2 and the cathode conductive member 3 are respectively biased to positive and negative polarities as illustrated in FIG. 2. At first, the auxiliary thyristor 200 is triggered. The triggered current flows in the gate portion of the main thyristor pellet 10 through the anode conductive member 2, the spring-like metal portion 600, the screwed metal portion 61, the anode electrode 202, the light triggered thyristor pellet 20, the cathode electrode 203, and the gate lead wire 5. Thus the main thyristor 100 turns on. As illustrated in FIG. 2, a resistance component having a certain value generally exists between the gate portion $P_B$ of the thyristor pellet 10 and the emitter portion $n_E$ thereof. Once the thyristor pellet 10 turns conductive, most of the main circuit current flows through the main thyristor 100. Accordingly, the auxiliary thyristor 200 turns off in a short time.

In this embodiment, the pellet 20 of the auxiliary thyristor 200 is not formed on the same substrate as the thyristor pellet 10 through which the main circuit current flows. Therefore, the pellet 20 of the auxiliary thyristor is hardly affected by the heat generated when the main current flows. In addition, the auxiliary thyristor 200 turns off in a short time. As a result, the temperature rise is small. Therefore, the trade-off relationship between the light-triggering sensitivity and dv/dt capability, which highly depends upon the temperature, can be significantly improved. Since the auxiliary thyristor 200 can be easily attached or removed from the main thyristor by using the connector portion 60, the auxiliary thyristor can be attached to the main thyristor 100 after the main thyristor 100 has been constructed. When the auxiliary thyristor 200 gets out of order, for example, therefore, it can be easily replaced by a new auxiliary thyristor. Further, the degree of freedom of combination between the auxiliary thyristor 200 and the main thyristor (in the blocking voltage, current capacity, and turn on time, for example) is advantageously increased. Further, the wiring between both thyristors can be made short. Since values of the stray inductance and capacitance generated between wires can be reduced, therefore, their bad influence can be reduced.

Figure 3:
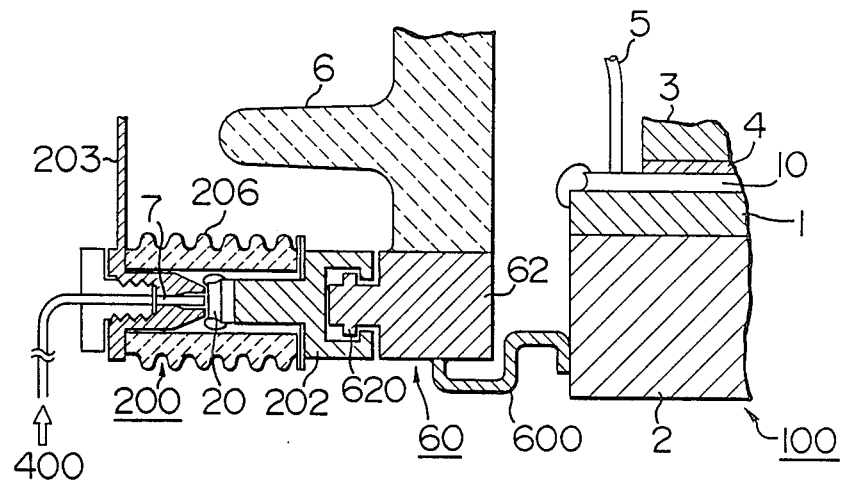
FIG. 3 is a sectional view showing a principal part of a second embodiment of the present invention.

FIG. 3 is a sectional view of a second embodiment of the present invention. Identical reference numerals are employed in FIG. 3 to designate elements having the same structure and function as those of FIG. 1. The connector portion 60 coupling the auxiliary thyristor 200 to the main thyristor 100 comprises the screwed metal portion 61 in the embodiment of FIG. 1. From the viewpoint of principle, however, the connector portion need not necessarily have such a structure. In the embodiment of FIG. 3, therefore, a metal portion 62 having a projection 620 is disposed as the connector portion and the anode electrode 202 of the auxiliary thyristor 200 has a BNC connector (baby N connector) structure resembling a cap nut so that the auxiliary thyristor may be freely attached to and removed from the connector portion 60.

Figure 4:
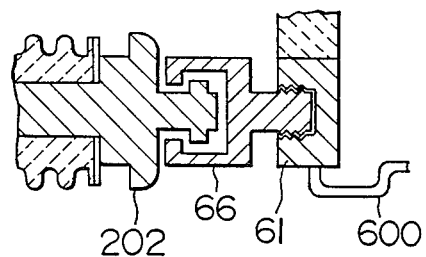
FIG. 4 is a sectional view showing a part of a variant example of the second embodiment.

Since in the embodiment of FIG. 3 the connector portion 60 for fixing the auxiliary thyristor 200 resembles a BNC connector, the auxiliary thyristor can be attached to and removed from the connector portion 60 with one touch. In addition, it is expected that the tightness between the main thyristor and the auxiliary thyristor is not degraded even if the whole main thyristor 100 should vibrate. In FIG. 3, the anode electrode 202 of the auxiliary thyristor 200 forms the BNC connector structure in conjunction with the metal portion 62 fixed to the cylindrical insulator 6. Instead, a structure as illustrated in FIG. 4 may be used. In FIG. 4, a conversion metal member 66 having a new third BNC connector structure is inserted into and coupled to the screwed metal portion 61 used in the embodiment of FIG. 1. In this case, a typical structure can be used as the cathode electrode structure of the auxiliary thyristor. And the auxiliary thyristor can be freely replaced only by changing this conversion metal member to various shaped ones, resulting in further expanded application.

Figure 5:
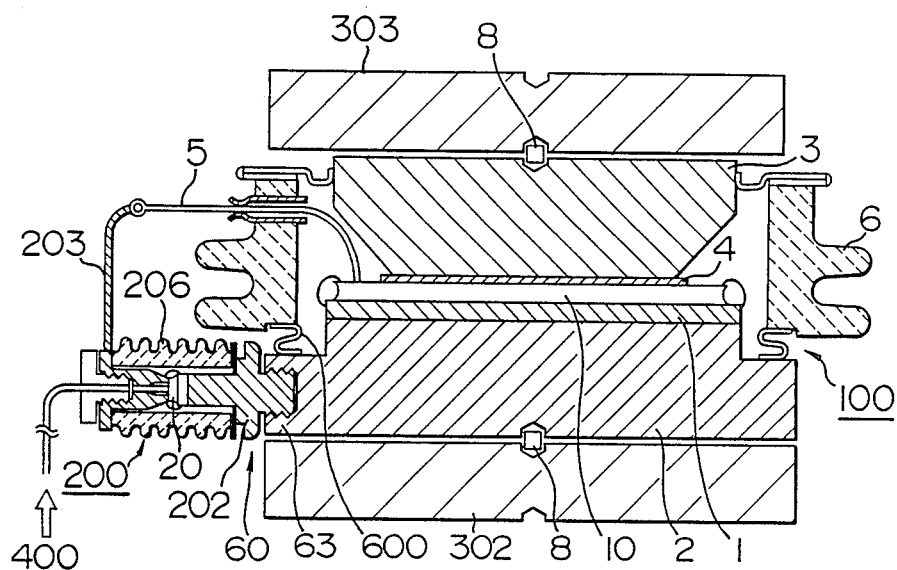
FIG. 5 is a sectional view of a third embodiment of the present invention.

FIG. 5 shows a third embodiment of the present invention. In this embodiment as well, identical reference numerals are employed in FIG. 5 to designate elements having the same structure and function as those of FIG. 1.

The embodiment of FIG. 5 differs from that of FIG. 1 in that the connector portion 60 for coupling the auxiliary thyristor 200 to the main thyristor 100 is disposed in the anode conductive member 2 of the thyristor 100.

That is to say, a screwed portion (a female screwed portion, for example) 63 is formed on the side face of the anode conductive member 2 of the thyristor 100, and a male screwed anode end of the auxiliary thyristor 202 is so formed as to be screwed into the female screwed portion 63.

While the embodiment of FIG. 1 needs the process for sticking the screwed metal portion 61 to the cylindrical insulator 6 by using silver solder or the like when forming the insulator, such a process can be omitted in the embodiment of FIG. 5 since the screwed metal portion 61 is not needed. Further, the auxiliary thyristor 200 is directly attached to the anode conductive member 2. Accordingly, the auxiliary thyristor is close to the cooling fin 302. As a result, its cooling effect is further improved as compared with the embodiment of FIG. 1.

Figure 6:
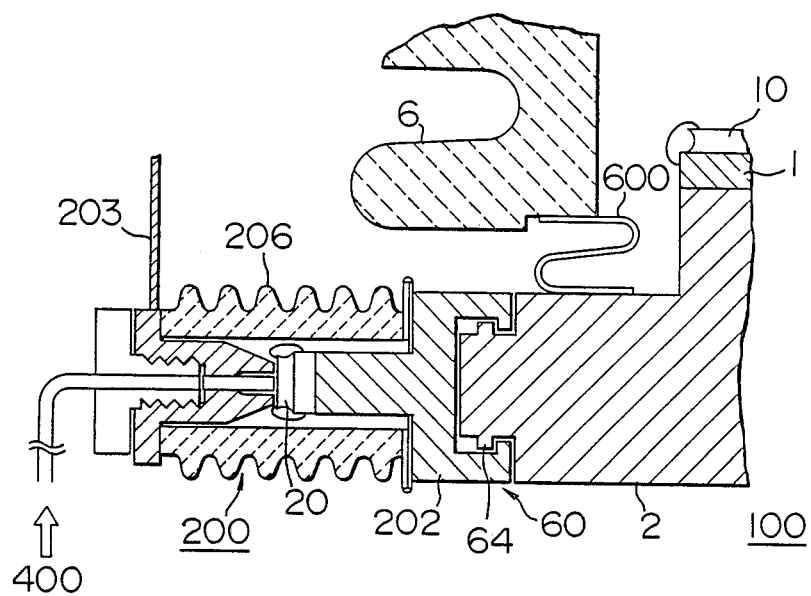
FIG. 6 is a sectional view showing a principal part of a fourth embodiment of the present invention.

FIG. 6 is a sectional view of a fourth embodiment of the present invention. This embodiment can be obtained by changing the connector portion 60 of the embodiment illustrated in FIG. 5 from the screw shape to the BNC connector shape and by applying the coupling method of the connector portion 60 used in the embodiment of FIG. 3 to the embodiment of FIG. 5.

That is to say, a male portion 64, for example, of a BNC connector is formed on the side face of the anode conductive member 2 of the main thyristor and a female portion, for example, of the BNC connector is formed on the end of the anode 202 of the auxiliary thyristor.

By this embodiment, therefore, the effect of the second embodiment can be obtained concurrently with that of the third embodiment.

Figure 7:
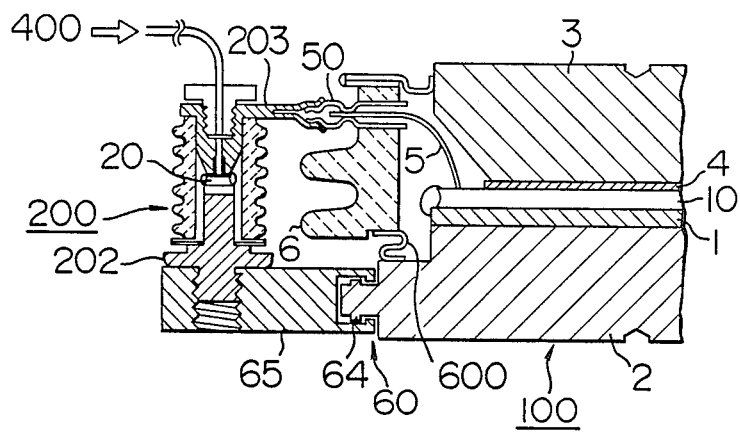
FIG. 7 is a sectional view showing a principal part of a fifth embodiment of the present invention.

FIG. 7 is a sectional view of a fifth embodiment of the present invention. This embodiment differs from the above described fourth embodiment in that the auxiliary thyristor 200 is coupled to the main thyristor 100 via a conductive coupling piece 65.

That is to say, the male portion 64, for example, of the BNC connector is formed on the side face of the anode conductive member 2 of the main thyristor, and a screwed portion, for example a male screwed portion, is formed on the end of the anode 202 of the auxiliary thyristor 200. On one end of the coupling piece 65, a female portion, for example, of the BNC connector is formed to be coupled to the male portion 64. On the other end of the coupling piece 65, a screwed portion, for example a female screwed portion, is formed to threadedly engage to the male screwed portion of the anode of the auxiliary thyristor.

Further in this embodiment, a metal gate pipe 50 is disposed to pass the gate lead wire 5 through the cylindrical insulator 6, and the end of the metal gate pipe 50 has an uneven surface. On the other hand, the end of the cathode electrode 203 has an uneven surface so that the gate pipe 50 may be elastically inserted into the cathode electrode 203 of the auxiliary thyristor.

In this way, the auxiliary thyristor 200 having the conductive coupling piece 65 attached thereto beforehand can be simply coupled to the main thyristor 100. When the auxiliary thyristor is replaced, another auxiliary thyristor having a different shape of anode electrode can be attached to the main thyristor only by replacing the conductive coupling piece 65, resulting in further expanded application. The metal gate pipe 50 may be applied to other embodiments described above.

Figure 8:
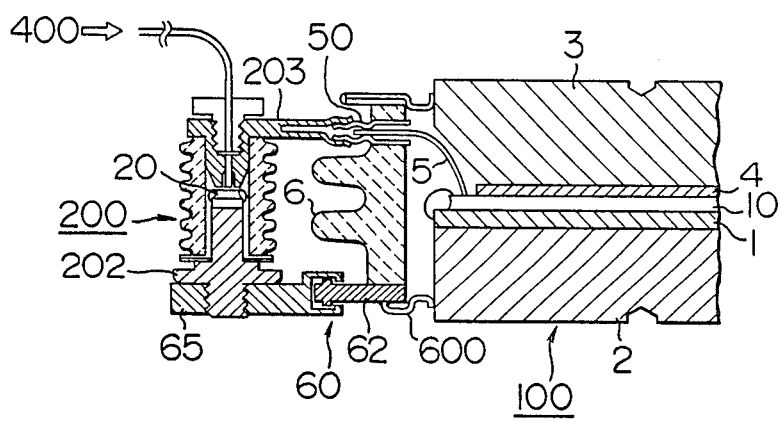
FIG. 8 is a sectional view showing a principal part of a sixth embodiment of the present invention.

Lastly, FIG. 8 is a sectional view of a sixth embodiment of the present invention. This embodiment can be obtained by using the structure of the connector portion of the above described second embodiment as the structure of the electric gate main thyristor 100 side of the conductive coupling piece 65 illustrated in FIG. 7 of the fifth embodiment.

In the embodiment of FIG. 7, the male portion of the BNC connector of the connector portion 60 is formed on the end of the anode conductive member 2. In the embodiment of FIG. 8, however, the male portion is formed on the end of the metal portion 62, which is attached to the cylindrical insulator 6 and is connected to the anode conductive member 2 via the spring-like metal member 600.

Therefore, the embodiment of FIG. 8 has effects of both the fifth and second embodiments.

Various embodiments have heretofore been described. In summary, the feature of the present invention is as follows. When the light triggered auxiliary thyristor for triggering is electrically connected to the electric gate thyristor for the main circuit, the anode side coupling portion of the former thyristor is so attached to a portion of the cylindrical insulator of the latter thyristor that they may be freely connected and disconnected, or is so attached to the anode conductive member of the latter thyristor that they may be freely connected and disconnected. It is evident that this is possible in any of combinations which have been described as embodiments.

In such a light triggered device using an auxiliary thyristor, a resistor R as illustrated in the equivalent circuit of FIG. 2 is sometimes disposed for limiting the conduction current of the light triggered auxiliary thyristor 200 to a predetermined value.

On the other hand, the conductive coupling piece 65 is used in the connector portion 60 of the embodiments of FIGS. 7 and 8.

Therefore, it is possible to simply and surely provide a current limiting resistor R as represented by the equivalent circuit of FIG. 2 only by making the conductive coupling piece 65 of a material having predetermined conductivity so that the conduction path of the connector portion 60 between the anode conductive member 2 and the anode electrode 202 may have a predetermined resistance value.

In accordance with the present invention as described above, the auxiliary thyristor for triggering and the electric gate thyristor for main circuit are separately made and are united into one body structure so that they may be freely connected and disconnected outside. As compared with a conventional light triggered thyristor device having both thyristors disposed on the same semiconductor substrate, therefore, the trade-off relationship between the light-triggering sensitivity and the dv/dt capability can be significantly improved. As compared with the conventional light triggered thyristor device, results of experiments conducted by the present inventors show that the dv/dt capability can be increased to approximately four times for the same light triggering sensitivity and that the light triggering sensitivity can be increased to approximately twice for the same dv/dt capability. Further, even if the auxiliary thyristor which is inferior in reliability as compared with the main thyristor because of the presence of its light introducing portion gets out of order, only the auxiliary thyristor portion having a smaller capacity than the main thyristor can be exchanged. Accordingly, the overall device is economically advantageous. Further, since the structure of the present invention can be applied to main thyristors having various current capacities, the degree of freedom in combination is increased. Thus, it becomes possible to construct a light triggered device suitable having wide application.

We claim:

1. A light triggered thyristor device comprising:
a main thyristor triggered by an electric triggering signal;
an auxiliary thyristor triggered by a light signal applied to a light receiving portion, said auxiliary thyristor then supplying said electric triggering signal from a cathode thereof to a gate of said main thyristor;

a cylindrical insulator for containing said main thyristor;

a connector mechanism disposed near an end of an anode on a side face of said main thyristor and electrically connected to the anode of said main thyristor, said connector mechanism having one end side exposed outside of said cylindrical insulator, said auxiliary thyristor being so attached to said one end side of said connector mechanism outside of said cylindrical insulator containing said main thyristor as to enable their free connection and disconnection, the anode of said main thyristor being electrically connected to the anode of said auxiliary thyristor via said connector mechanism.

2. A light triggered thyristor device according to claim 1, wherein said connector mechanism is disposed on a part of said cylindrical insulator and is connected to the anode of said main thyristor via a metal member, and the anode portion of said auxiliary thyristor is so attached to one end side of said connector mechanism as to freely connect and disconnect them.

3. A light triggered thyristor device according to claim 2, wherein said connector mechanism comprises:

a first connector member stuck onto said cylindrical insulator and connected to the anode portion of said main thyristor via said metal member; and a second connector member having one end so attached to the anode of said auxiliary thyristor that they may be freely connected and disconnected and having the other end so attached to said first connector member that they may be freely connected and disconnected.

4. A light triggered thyristor device according to claim 1, wherein said connector mechanism is on the side face of said main thyristor and wherein the anode portion of said auxiliary thyristor can be so attached to one end side of said connector mechanism that they may be freely connected and disconnected.

5. A light triggered thyristor device according to claim 4, wherein said connector mechanism comprises:

a first connector member disposed on the side face of the anode of said main thyristor; and a second connector member having one end side so attached to the anode of said auxiliary thyristor that they may be freely connected and disconnected and having the other end side so attached to said first connector member that they may be freely connected and disconnected.

6. A light triggered thyristor device according to claim 3, wherein said second connector member has a predetermined resistance value required to limit the conduction current of said auxiliary thyristor to a value lower than a predetermined value.

7. A light triggered thyristor device according to claim 5, wherein said second connector member has a predetermined resistance value required to limit the conduction current of said auxiliary thyristor to a value lower than a predetermined value.

8. A light triggered thyristor device according to claim 2, wherein said connector mechanism comprises a baby N connector.

9. A light triggered thyristor device according to claim 4, wherein said connector mechanism comprises a baby N connector.

* * * * *